(12) United States Patent
Lee et al.

(10) Patent No.: US 8,841,969 B2
(45) Date of Patent: Sep. 23, 2014

(54) AUTOMATIC GAIN CONTROL FEEDBACK AMPLIFIER

(71) Applicant: Electronics and Telecommunications Research Institute, Daejeon (KR)

(72) Inventors: Sang-Heung Lee, Daejeon (KR); Seong-Il Kim, Daejeon (KR); Dong Min Kang, Daejeon (KR); Jong-Won Lim, Daejeon (KR); Hyung Sup Yoon, Daejeon (KR); Chull Won Ju, Daejeon (KR); Jae Kyoung Mun, Daejeon (KR); Eun Soo Nam, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 74 days.

(21) Appl. No.: 13/670,016

(22) Filed: Nov. 6, 2012

(65) Prior Publication Data
US 2013/0169365 A1 Jul. 4, 2013

(30) Foreign Application Priority Data

Dec. 29, 2011 (KR) .......................... 10-2011-0146139

(51) Int. Cl.
*H03G 3/12* (2006.01)
(52) U.S. Cl.
USPC .......................................... 330/282; 330/279
(58) Field of Classification Search
CPC .................................. H03F 1/342; H03F 1/345
USPC .......................... 330/282, 279, 260, 261, 85
See application file for complete search history.

(56) References Cited

U.S. PATENT DOCUMENTS

| 5,121,075 | A | * | 6/1992 | Roach | 330/126 |
| 5,138,280 | A | * | 8/1992 | Gingrich et al. | 330/295 |
| 5,291,151 | A | * | 3/1994 | Fujiwara et al. | 330/282 |
| 6,404,282 | B2 | * | 6/2002 | Kikuchi et al. | 330/86 |
| 6,882,226 | B2 | * | 4/2005 | Cho et al. | 330/282 |
| 7,157,977 | B2 | | 1/2007 | Lee et al. | |
| 7,245,179 | B2 | * | 7/2007 | Chang | 330/86 |
| 7,256,648 | B2 | * | 8/2007 | Takagishi et al. | 330/86 |
| 2009/0102552 | A1 | | 4/2009 | Shiramizu et al. | |

FOREIGN PATENT DOCUMENTS

| JP | 57-194613 A | 11/1982 |
| KR | 10-2005-0049862 A | 5/2005 |
| KR | 10-2007-0061175 A | 6/2007 |

\* cited by examiner

*Primary Examiner* — Henry Choe
(74) *Attorney, Agent, or Firm* — Rabin & Berdo, P.C.

(57) ABSTRACT

Disclosed is an automatic gain control feedback amplifier that can arbitrarily control a gain even when a difference in input signal is large. The automatic gain control feedback amplifier includes: an amplification circuit unit configured to amplify voltage input from an input terminal and output the amplified voltage to an output terminal; a feedback circuit unit connected between the input terminal and the output terminal and including a feedback resistor unit of which a total resistance value is determined by one or more control signals and a feedback transistor connected to the feedback resistor unit in parallel; and a bias circuit unit configured to supply predetermined bias voltage to the feedback transistor.

9 Claims, 5 Drawing Sheets

AUTOMATIC GAIN CONTROL FEEDBACK AMPLIFIER

CROSS-REFERENCE TO RELATED APPLICATIONS

This application is based on and claims priority from Korean Patent Application No. 10-2011-0146139, filed on Dec. 29, 2011, with the Korean Intellectual Property Office, the disclosure of which is incorporated herein in its entirety by reference.

TECHNICAL FIELD

The present disclosure relates to a feedback amplifier used as a pre-amplifier of an optical communication system, and more particularly, a feedback amplifier capable of achieving automatic gain control.

BACKGROUND

A feedback amplifier used as a pre-amplifier of an optical communication system includes an amplifier circuit in order to amplify an input signal. A feedback circuit is provided in the feedback amplifier in order to control a level of output voltage and includes a feedback resistor connected between an input terminal and an output terminal, and a feedback transistor connected to the feedback resistor in parallel. Herein, a control signal is applied to a base of the feedback transistor to control feedback current that flows through the feedback circuit and control output voltage.

A method of applying the control signal to the base of the feedback transistor includes a method of generating the control signal by configuring an additional gain control signal generating circuit outside the feedback amplifier and a method of autonomously generating the control signal with a bias circuit provided in the feedback amplifier.

FIG. 1 is a circuit diagram of a feedback amplifier in the related art.

Referring to FIG. 1, a feedback amplifier 100 in the related art is connected between an input terminal IN and an output terminal OUT. The input terminal IN is connected to a photodiode PD connected to a power supply VCC. Input current in corresponding to cathode current of the photodiode PD is supplied to the input terminal IN.

The input terminal IN is connected to a base of a first NPN transistor 110. A collector of the first NPN transistor 110 is connected to the power supply VCC and a base of a second NPN transistor 130 through a first resistor 120. A collector of the second NPN transistor 130 is connected to the power supply VCC, and an emitter of the second NPN transistor 130 is connected to the output terminal OUT and connected to a ground terminal through a second resistor 140. An emitter of the first NPN transistor 110 is also grounded.

A feedback circuit 150 includes a feedback resistor 152 and a feedback transistor 154. The output terminal OUT is connected to the base of the first NPN transistor 110 through the feedback resistor 152. An emitter of the feedback transistor 154 is connected to the output terminal OUT and a collector of the feedback transistor 154 is connected to the base of the first NPN transistor 110. A control signal V_AGC is applied to a base of the feedback transistor 154 from an external circuit (not illustrated) for controlling the feedback current.

When a low-voltage control signal V_AGC is applied to the base of the feedback transistor 154 in the feedback amplifier 100, the feedback transistor 154 is turned off while impedance between the collector and the emitter of the feedback transistor 154 sufficiently increases. Therefore, the feedback transistor 154 is equivalent to an opened state, and transimpedance is regarded as the same as a resistance value of the feedback resistor 152.

When the level of the control signal V_AGC increases, the feedback transistor 154 is turned on, and thus the impedance between the collector and the emitter of the feedback transistor 154 decreases. As a result, the feedback resistor 152 and the impedance are connected in parallel to thereby decrease the transimpedance. Accordingly, a gain of the feedback amplifier 100 is controlled in response to the control signal V_AGC.

That is, when the control signal V_AGC is changed in response to the input current in in the feedback amplifier 100, the control signal V_AGC is determined based on the input current in a range in which the output voltage S100 is not saturated. An additional gain control signal generating circuit needs to be configured in order to supply the control signal V_AGC as an appropriate signal value. Therefore, the gain control signal generating circuit supplies the control signal V_AGC to the feedback amplifier 100.

However, the feedback amplifier in the related art has a problem that the gain cannot be arbitrarily controlled when a difference in input signal is large because the gain is controlled by using only turn-on resistance of the feedback transistor.

SUMMARY

The present disclosure has been made in an effort to provide an automatic gain control feedback amplifier that can arbitrarily control a gain even when a difference in input signal is large.

An exemplary embodiment of the present disclosure provides an automatic gain control feedback amplifier including: an amplification circuit unit configured to amplify voltage input from an input terminal and output the amplified voltage to an output terminal; a feedback circuit unit connected between the input terminal and the output terminal and including a feedback resistor unit of which a total resistance value is determined by one or more control signals and a feedback transistor connected to the feedback resistor unit in parallel; and a bias circuit unit configured to supply predetermined bias voltage to the feedback transistor. The automatic gain control feedback amplifier may further include a phase compensating circuit unit connected between the amplification circuit unit and the bias circuit unit.

The feedback resistor unit may further include a fixed resistor connected between the input terminal and the output terminal; one or more feedback resistors selectively connected to the fixed resistor in parallel by the one or more control signals; and one or more switches that are connected to the one or more feedback resistors, respectively in series and are turned on or off by the one or more control signals.

The feedback resistor unit may further include one or more capacitors connected to the one or more feedback resistors, respectively in parallel.

According to the exemplary embodiments of the present disclosure, the feedback amplifier can be implemented, which automatically controls a gain as input current increases by controlling a resistance value of a feedback resistor unit by using one or more control signals. Therefore, even when the difference in input signal is large, the gain of the feedback amplifier can be arbitrarily controlled.

The foregoing summary is illustrative only and is not intended to be in any way limiting. In addition to the illustra-

DETAILED DESCRIPTION

In the following detailed description, reference is made to the accompanying drawing, which form a part hereof. The illustrative embodiments described in the detailed description, drawing, and claims are not meant to be limiting. Other embodiments may be utilized, and other changes may be made, without departing from the spirit or scope of the subject matter presented here.

Figure 1:
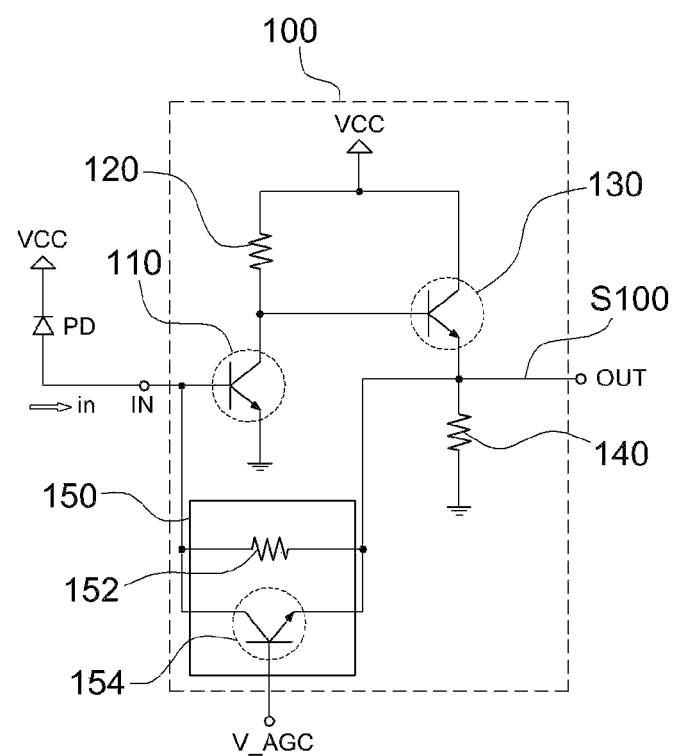
FIG. 1 is a circuit diagram of a feedback amplifier in the related art.
Figure 2A:
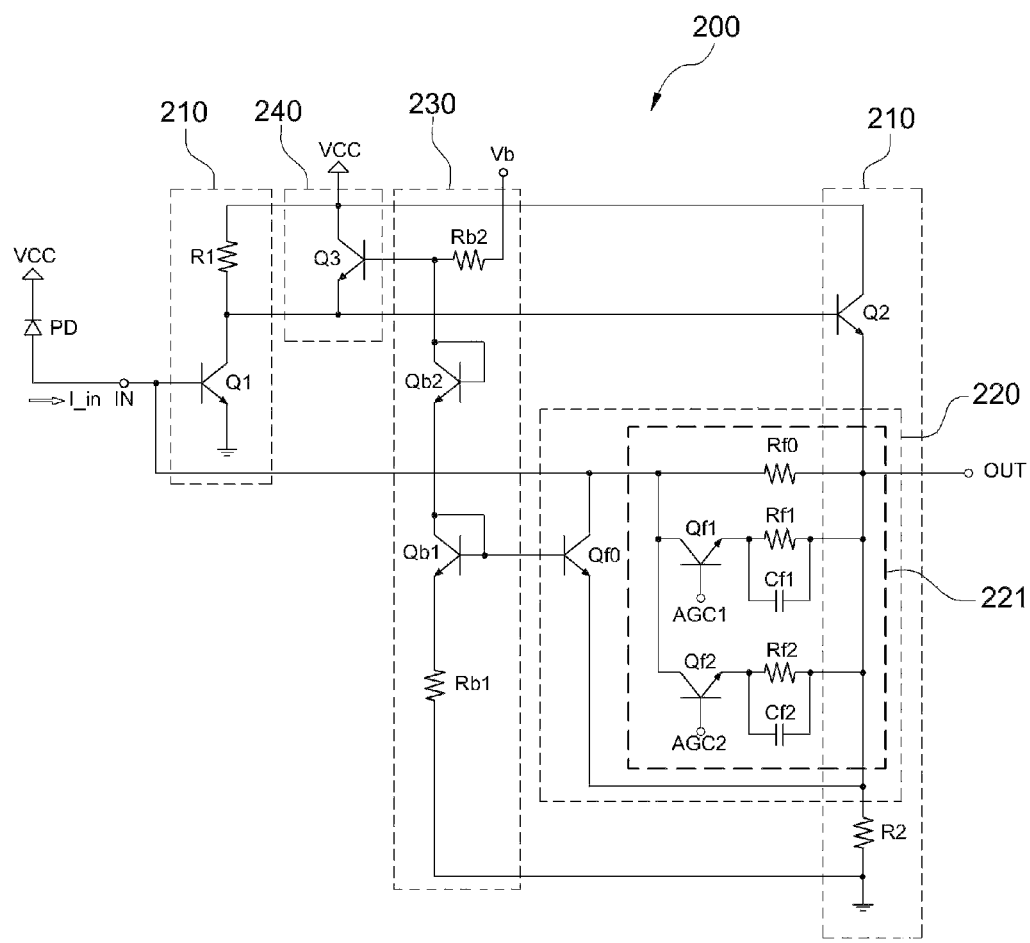
FIG. 2A is a circuit diagram of an automatic gain control feedback amplifier according to an exemplary embodiment of the present disclosure.

FIG. 2A is a circuit diagram of an automatic gain control feedback amplifier according to an exemplary embodiment of the present disclosure.

Referring to FIG. 2A, an automatic gain control feedback amplifier 200 according to an exemplary embodiment of the present disclosure includes an amplification circuit unit 210 configured to amplify voltage input from an input terminal IN and output the amplified voltage to an output terminal OUT, a feedback resistor unit 221 connected between the input terminal IN and the output terminal OUT, of which a total resistance value is determined by one or more control signals, a feedback circuit unit 220 including a feedback transistor Qf0 connected to the feedback resistor unit 221 in parallel and a bias circuit unit 230 configured to supply predetermined bias voltage to the feedback transistor Qf0. The automatic gain control feedback amplifier 200 may further include a phase compensating circuit unit 240.

The input terminal IN is electrically connected to a power supply VCC, and a photodiode PD is connected between the input terminal IN and the power supply VCC. The photodiode PD detects input voltage, and cathode current I_in of the photodiode PD is input into the feedback amplifier 200 through the input terminal IN.

The amplification circuit unit 210 generates output voltage by amplifying the input voltage, and includes a first transistor Q1, a first resistor R1, a second transistor Q2 and a second resistor R2.

A base of the first transistor Q1 is connected to the input terminal IN, an emitter thereof is grounded, and a collector thereof is connected to the first resistor R1. One end of the first resistor R1 is connected to the collector of the first transistor Q1 and the other end thereof is grounded. A base of the second transistor Q2 is connected to the collector of the first transistor Q1, a collector thereof is connected to the power supply VCC, and an emitter thereof is connected to the output terminal OUT. One end of the second resistor R2 is connected to the emitter of the second transistor Q2 and the output terminal OUT, and the other end thereof is grounded.

The feedback circuit unit 220 includes the feedback resistor unit 221 of which a total resistance value is variable by using one or more control signals and the feedback transistor Qf0.

In the exemplary embodiment, the feedback resistor unit 221 includes a fixed resistor Rf0 connected between the input terminal IN and the output terminal OUT, and first and second feedback resistors Rf1 and Rf2 connected to the fixed resistor Rf0 in parallel. The transistors Qf1 and Qf2 serving as a switch, which are turned on or off in response to first and second control signals AGC1 and AGC2 are connected to the first and second feedback resistors Rf1 and Rf2, respectively, in series. The first and second control signals AGC1 and AGC2 are applied to the bases of the transistors Qf1 and Qf2, respectively, so that the first and second feedback resistors Rf1 and Rf2 can be selectively connected to the fixed resistor Rf0 in parallel. For example, when the transistor Qf1 is turned on by the first control signal AGC1 and the transistor Qf2 is turned off by the second control signal AGC2, only the first feedback resistor Rf1 is connected to the fixed resistor Rf0 in parallel, and in this case, a total resistance value of the feedback resistor unit 221 becomes $(Rf0 \cdot Rf1)/(Rf0+Rf1)$ Ω.

Meanwhile, when both the first and second feedback resistors Qf1 and Qf2 are connected to each other in parallel to decrease the total resistance value of the feedback resistor unit 221, a frequency response of the feedback amplifier 200 reaches a peak. In this case, the frequency response needs to be planarized in order to improve the performance of the feedback amplifier 200. Accordingly, capacitors Cf1 and Cf2 may be additionally connected to the feedback resistors Rf1 and Rf2, respectively, in parallel in order to compensate the frequency response of the feedback amplifier 200 due to the decrease of the total resistance value of the feedback resistor unit 221. That is, by connecting the capacitors Cf1 and Cf2 to the feedback resistors Rf1 and Rf2, respectively, in parallel, the frequency response due to the decrease of the total feedback resistance value may be compensated.

A collector of the feedback transistor Qf0 is connected to the input terminal IN, an emitter thereof is connected to the output terminal OUT, and a base thereof receives predetermined bias voltage from the bias circuit unit 230.

The bias circuit unit 230 includes a first bias transistor Qb1, a second bias transistor Qb2, a first bias voltage Rb1 and a second bias voltage Rb2, and supplies the predetermined bias voltage to the feedback transistor Qf0 of the feedback circuit unit 220.

A base and a collector of the first bias transistor Qb1 are commonly connected, and the commonly connected base and collector are connected to the base of the feedback transistor Qf0. One end of the first bias resistor Rb1 is connected to an emitter of the first bias transistor Qb1 and the other end thereof is grounded. A base and a collector of the second bias transistor Qb2 are commonly connected, and an emitter thereof is connected to the collector of the first bias transistor Qb1. One end of the second bias resistor Rb2 is connected to the collector of the second bias transistor Qb2 and the other end thereof is applied with a bias voltage Vb.

The phase compensating circuit unit 240 includes a third transistor Q3, and a collector of the third transistor Q3 is connected to the power supply VCC, a base thereof is connected to the second bias resistor Rb2, and an emitter thereof is connected to the collector of the first transistor Q1. The phase compensating circuit unit 240 prevents an output waveform from being distorted with the increase of a feedback current amount.

Hereinafter, an automatic gain control action of the feedback amplifier 200 according to the exemplary embodiment of the present disclosure will be described based on the aforementioned configuration.

Both the transistors Qf1 and Qf2 of the feedback resistor unit 221 receive the first and second control signals AGC1 and AGC2 through the bases thereof, respectively to serve as the switch.

When both the transistors Qf1 and Qf2 are turned off by the first and second control signals AGC1 and AGC2, a resistance value of the fixed resistor Rf0 becomes the total feedback resistance value to acquire a high gain.

When the transistor Qf1 is turned on and the transistor Qf2 is turned off by the first and second control signals AGC1 and AGC2, the fixed resistor Rf0 and the first feedback resistor Rf1 are connected to each other in parallel, such that the total feedback resistance value is smaller than the resistance value of the fixed resistor Rf0 and a low gain is acquired.

When the transistor Qf1 is turned off and the transistor Qf2 is turned on by the first and second control signals AGC1 and AGC2, the fixed resistor Rf0 and the second feedback resistor Rf2 are connected to each other in parallel, such that the total feedback resistance value is smaller than the resistance value of the fixed resistor Rf0 and the low gain is acquired.

When both the transistors Qf1 and Qf2 are turned on by the first and second control signals AGC1 and AGC2, the fixed resistor Rf0, the first feedback resistor Rf1 and the second feedback resistor Rf2 are connected in parallel, such that the total feedback resistance value is smaller than the resistance value of the fixed resistor Rf0 and a very low gain is acquired.

Herein, three resistors Rf0, Rf1 and Rf2 may have the same resistance value as each other and may have different resistance values.

Since the feedback transistor Qf0 of the feedback circuit unit 220 is connected to the base of the first bias transistor Qb1 of the bias circuit unit 230, an action of the feedback transistor Qf0 is fixed by the bias voltage Vb supplied from the bias circuit unit 230. That is, impedance between a collector and an emitter of the feedback transistor Qf0 is controlled by a voltage level of the output terminal OUT determined by the bias voltage Vb.

As a result, when the input current I_in is sufficiently small, the voltage level of the output terminal OUT is not substantially deviated from an acting point Q-point. Thus, the feedback transistor Qf0 is turned off, and the collector and the emitter of the feedback transistor Qf0 are opened from each other. As a result, the feedback circuit unit 220 is configured by only a resistance of the feedback resistor unit 221 to perform the substantially same action as a feedback amplifier without an automatic gain control function. Therefore, the voltage of the output terminal OUT is substantially the same as a value obtained by multiplying the total resistance value of the feedback resistor unit 221 and the input current I_in.

When the input current I_in increases, the feedback transistor Qf0 is turned on while the voltage level of the output terminal OUT is gradually lower than the acting point. As a result, the feedback transistor Qf0 is conducted, and as a result, the impedance between the collector and the emitter decreases and total impedance of the feedback circuit unit 220 decreases, thereby reducing a gain of the feedback amplifier 200. That is, the automatic gain control action is performed.

The automatic gain control action will be described in more detail. Since the base of the first bias transistor Qb1 is connected to the base of the feedback transistor Qf0, a voltage at approximately a diode turn-on voltage level is applied to the base of the feedback transistor Qf0. Meanwhile, since the collector of the feedback transistor Qf0 is connected to the base of the first transistor Q1 of the amplification circuit unit 210, a DC voltage at the approximately diode turn-on voltage level is also applied to the collector of the feedback transistor Qf0. As a result, the base and the collector of the feedback transistor Qf0 have similar DC voltage levels. When the input current I_in increases in such a DC current state (an acting point state), the voltage of the output terminal OUT is decreased by inversion amplification. In this case, since the output terminal OUT and the emitter of the feedback transistor Qf0 are connected to each other, the voltage of the emitter of the feedback transistor Qf0 decreases, and as a result, the feedback transistor Qf0 is turned on. Since the base and the collector of the feedback transistor Qf0 have the same DC voltage level, the feedback transistor Qf0 resultantly has a structure in which the base and the collector are connected, and as a result, the feedback transistor Qf0 performs a diode action. Accordingly, as current increases, resistance decreases. Herein, the base and the collector of the feedback transistor Qf0 are not connected in order to control the turn-on voltage of the feedback transistor Qf0 with the bias voltage Vb.

Since the feedback resistor unit 221 and the feedback transistor Qf0 are connected in parallel, when the total feedback resistance of the feedback resistor unit 221 is set as Rf and the turn-on resistance of the feedback transistor Qf0 is set as RQf, the total feedback impedance Zf of the feedback circuit unit 220 is expressed by [Equation 1] below.

$$Zf = Rf \| RQf \quad\quad\quad \text{[Equation 1]}$$

The gain of the feedback circuit unit 220 is expressed by [Equation 2] below.

$$\text{Gain} = V\_out/I\_in = -Zf \quad\quad\quad \text{[Equation 2]}$$

Therefore, when the input current I_in increases, the turn-on resistance RQf of the feedback transistor Qf0 decreases, and as a result, the total feedback impedance Zf also decreases. Since the gain of the feedback circuit unit 220 becomes a negative feedback impedance Zf, when the input current I_in increases, the gain of the feedback amplifier 200 also decreases. In this case, since the magnitude of minimum input current I_in required to start the automatic gain control action is determined by voltage applied to a base terminal of the feedback transistor Qf0, the desired magnitude of the minimum input current I_in may be arbitrarily set by adjusting the bias voltage Vb.

Therefore, base voltage of the feedback transistor Qf0 is fixed by the voltage supplied by the bias circuit unit 230 and the magnitude of the impedance between the collector and the emitter of the feedback transistor Qf0 is automatically controlled by the voltage level of the output terminal OUT connected with the emitter of the feedback transistor Qf0, and as a result, the additional gain control signal generating circuit is not required. As the input current I_in increases, the impedance of the feedback circuit unit 220 decreases, and as a result, the gain of the feedback amplifier 200 is automatically controlled.

That is, while the total feedback resistance value is determined depending on opening of the transistors Qf1 and Qf2 by the first and second control signals AGC1 and AGC2, the feedback amplifier 200 may control the gain by decreasing the impedance of the feedback circuit unit 220 with the increase of the input current I_in, and as a result, the feedback amplifier 200 may act while arbitrarily controlling the gain when the difference in input signal is large.

Figure 2B:
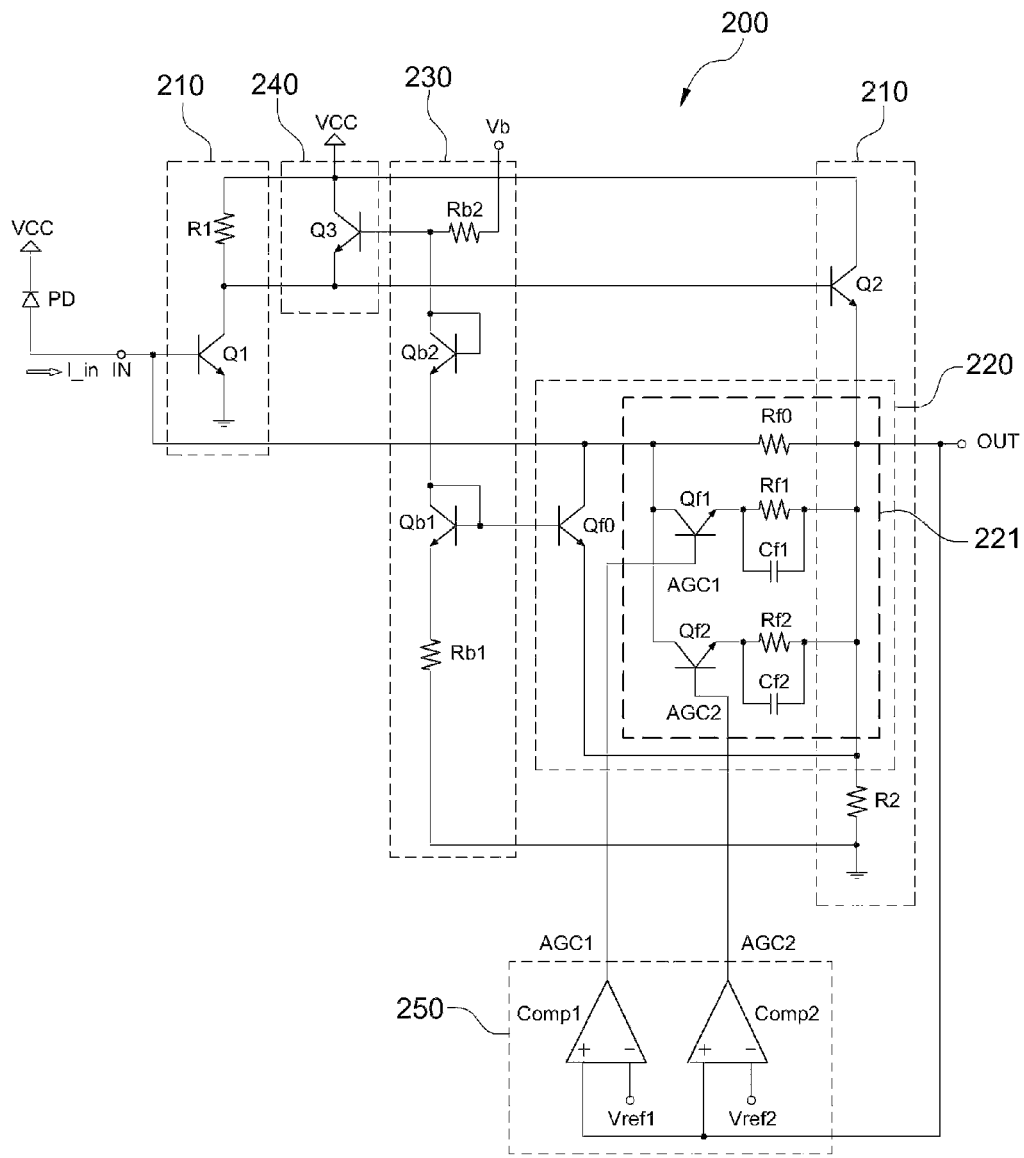
FIG. 2B is a circuit diagram of the feedback amplifier further including a control signal generating unit according to the exemplary embodiment of the present disclosure.

FIG. 2B is a circuit diagram of the feedback amplifier further including a control signal generating unit according to the exemplary embodiment of the present disclosure.

As illustrated in FIG. 2B, the feedback amplifier 200 may further include a control signal generating unit 250 including a first comparator Comp1 and a second comparator Comp2. The first comparator Comp1 compares the voltage of the output terminal OUT and first reference voltage Vref1 to generate the first control signal AGC1 and the second comparator Comp2 compares the voltage of the output terminal OUT and a second reference voltage Vref2 to generate the second control signal AGC2.

Figure 3A:
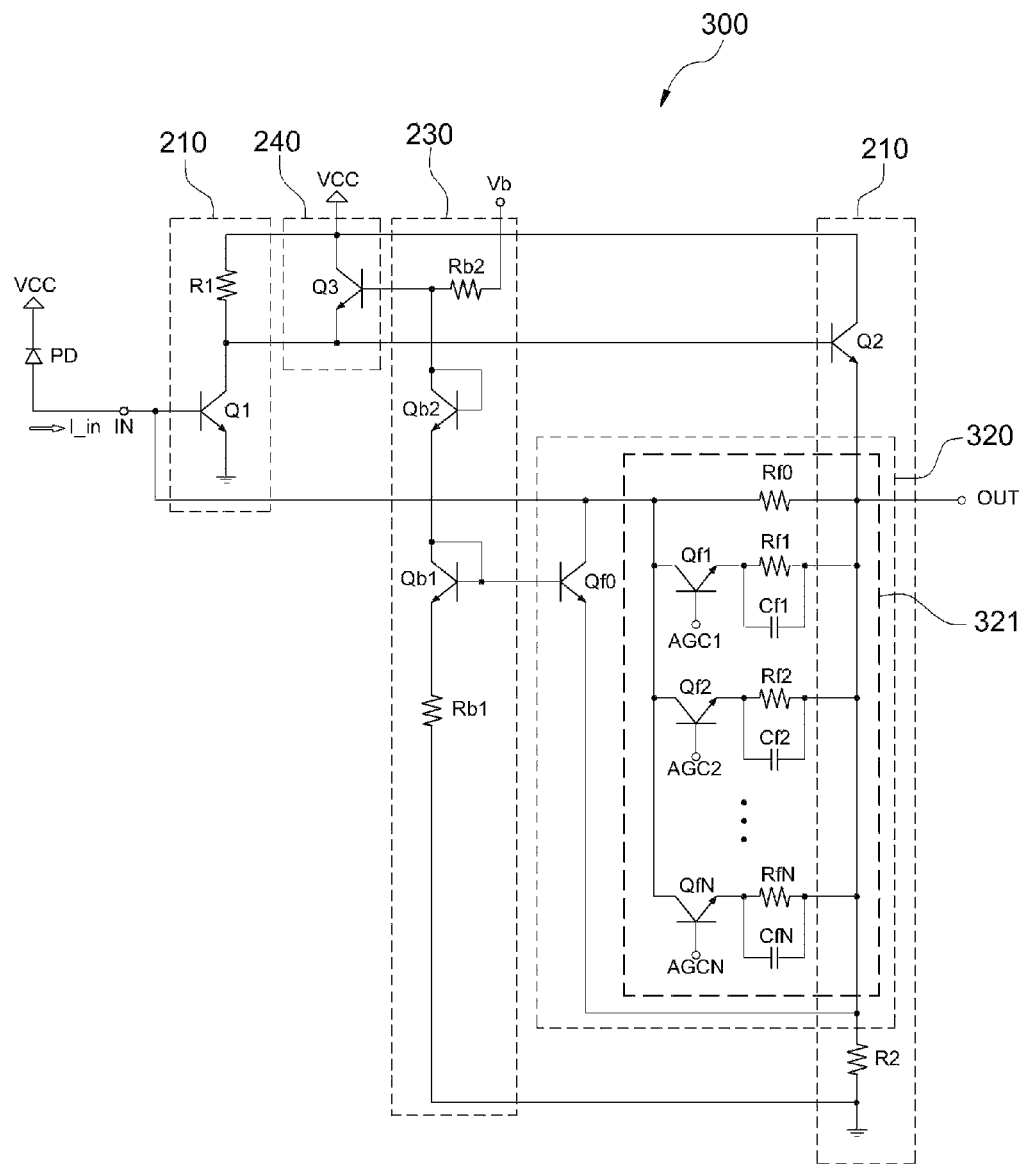
FIGS. 3A and 3B are circuit diagrams of a feedback amplifier according to another exemplary embodiment of the present disclosure.
Figure 3B:
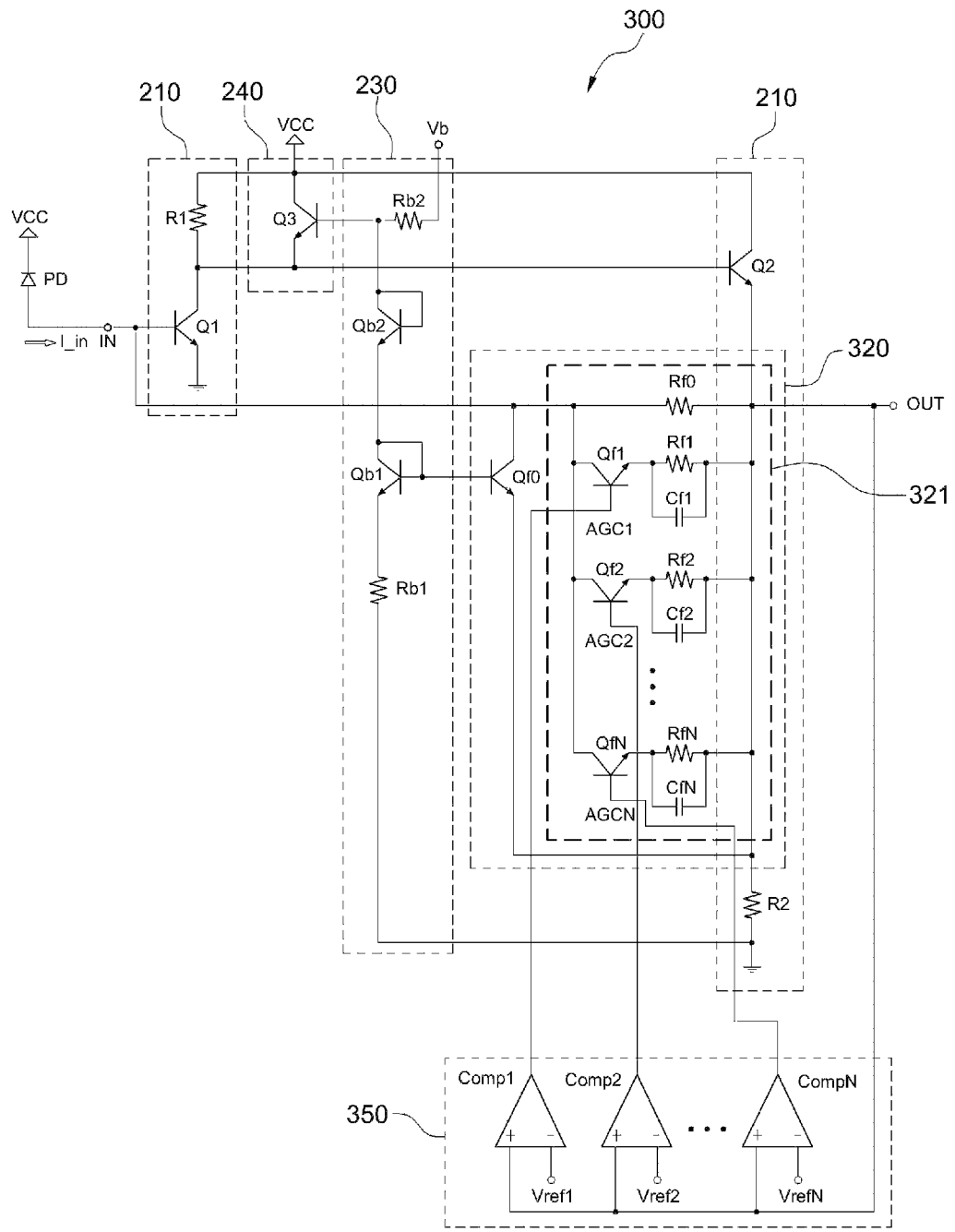

FIGS. 3A and 3B are circuit diagrams of a feedback amplifier according to another exemplary embodiment of the present disclosure.

As illustrated in FIG. 3A, a feedback amplifier 300 according to another exemplary embodiment of the present disclosure includes an amplification circuit unit 210, a feedback circuit unit 320, a bias circuit unit 230 and a phase compensating circuit unit 240.

A feedback resistor unit 321 of the feedback circuit unit 320 may include N feedback resistors Rf1, Rf2, ..., RfN connected to the fixed resistor Rf0 in parallel, N transistors Qf1, Qf2, ..., QfN connected to the N feedback resistors Rf1, Rf2, ..., RfN in series to serve as the switch and N capacitors Cf1, Cf2, ... CfN connected to N feedback resistors Rf1, Rf2, ..., RfN in parallel, respectively. The N transistors Qf1, Qf2, ..., QfN may be turned on or off by N control signals AGC1, AGC2, ..., AGCN, respectively. Remaining components and actions of the feedback amplifier 300 are the same as those described above with reference to FIG. 2.

As illustrated in FIG. 3B, the feedback amplifier 300 may further include a control signal generating unit 350 that compares the voltage of the output terminal OUT and N reference voltage Vref1, Vref2, ..., VrefN to generate N control signals AGC1, AGC2, ..., AGCN.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. An automatic gain control feedback amplifier, comprising:
   an amplification circuit unit configured to amplify voltage input from an input terminal and output the amplified voltage to an output terminal;
   a feedback circuit unit connected between the input terminal and the output terminal and including a feedback resistor unit of which a total resistance value is determined by one or more control signals and a feedback transistor connected to the feedback resistor unit in parallel; and
   a bias circuit unit configured to supply predetermined bias voltage to the feedback transistors;
   wherein the amplification circuit unit includes
      a first transistor of which a base is connected to the input terminal and an emitter is grounded,
      a first resistor of which one end is connected to a collector of the first transistor and the other end is connected to a power supply,
      a second transistor of which a base is connected to the collector of the first transistor, a collector is connected to the power supply, an emitter is connected to the output terminal, and
      a second resistor of which one end is connected to the output terminal and the other end is grounded.

2. The automatic gain control feedback amplifier of claim 1, wherein:
   the feedback resistor unit includes
   a fixed resistor connected between the input terminal and the output terminal; and
   one or more feedback resistors selectively connected to the fixed resistor in parallel by the one or more control signals.

3. The automatic gain control feedback amplifier of claim 2, wherein the feedback resistor unit further includes one or more switches that are connected to the one or more feedback resistors, respectively in series and are turned on or off by the one or more control signals.

4. The automatic gain control feedback amplifier of claim 2, wherein the feedback resistor unit further includes one or more capacitors connected to the one or more feedback resistors, respectively in parallel.

5. The automatic gain control feedback amplifier of claim 1, wherein a collector of the feedback transistor is connected to the input terminal, an emitter of the feedback transistor is connected to the output terminal, and a base of the feedback transistor receives the predetermined bias voltage.

6. The automatic gain control feedback amplifier of claim 1, further comprising:
   a control signal generating unit configured to generate the one or more control signals by comparing the voltage of the output terminal and one or more reference voltage.

7. The automatic gain control feedback amplifier of claim 1, wherein:
   the bias circuit unit includes
   a first bias transistor of which a base and a collector are commonly connected to the base of the feedback transistor;
   a first bias resistor of which one end is connected to an emitter of the first bias transistor and the other end is grounded;
   a second bias transistor of which an emitter is connected to the collector of the first bias transistor and a base is connected to the collector; and
   a second bias resistor of which one end is connected to a collector of the second bias transistor and the other end receives bias voltage.

8. The automatic gain control feedback amplifier of claim 7, further comprising:
   a phase compensating circuit unit connected between the amplification circuit unit and the bias circuit unit.

9. The automatic gain control feedback amplifier of claim 8, wherein the phase compensating circuit unit includes a third transistor of which a collector is connected to the power supply, a base is connected to the collector of the second bias transistor, and an emitter is connected to the collector of the first transistor.

* * * * *